United States Patent
Melane et al.

[11] Patent Number: 6,024,165
[45] Date of Patent: *Feb. 15, 2000

[54] THERMAL MANAGEMENT DEVICE AND SYSTEM FOR AN ELECTRONIC COMPONENT ENCLOSURE

[75] Inventors: Marcus L. Melane, Irving; David A. Bartek, Plano; Paul A. Tucker, Richardson; Andrew Low, McKinney, all of Tex.

[73] Assignee: DSC Telecom L.P., Plano, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 09/140,454

[22] Filed: Aug. 26, 1998

[51] Int. Cl.⁷ .................................................. F28D 15/00
[52] U.S. Cl. ............................. 165/104.33; 165/104.34; 361/724
[58] Field of Search ........................ 165/104.33, 104.34, 165/104.14; 361/724

[56] References Cited

U.S. PATENT DOCUMENTS

| | | | |
|---|---|---|---|
| 4,449,579 | 5/1984 | Miyazaki et al. | 165/104.33 |
| 4,600,050 | 7/1986 | Noren | 165/104.33 X |
| 4,798,238 | 1/1989 | Ghiraldi | 165/104.33 X |
| 4,921,043 | 5/1990 | Ghiraldi | 165/104.33 X |
| 5,529,120 | 6/1996 | Howard et al. | 165/104.33 X |
| 5,570,740 | 11/1996 | Flores et al. | 165/104.34 |
| 5,603,376 | 2/1997 | Hendrix | 165/104.34 |
| 5,806,583 | 9/1998 | Suzuki et al. | 165/104.33 |
| 5,823,248 | 10/1998 | Kadota et al. | 165/104.33 |
| 5,832,988 | 11/1998 | Mistry et al. | 165/104.33 X |

FOREIGN PATENT DOCUMENTS

| | | | |
|---|---|---|---|
| 0037938 | 4/1978 | Japan | 165/104.33 |
| 0006339 | 1/1983 | Japan | 165/104.33 |

OTHER PUBLICATIONS

An Introduction To Heat Pipes, Modeling, Testing, and Applications, G. P. Peterson, Wiley Series in Thermal Management of Microelectronic & Electronic Systems, John Wiley & Sons, Inc., Copyright 1994, pps. 318–326.

*Primary Examiner*—Christopher Atkinson
*Attorney, Agent, or Firm*—Locke Liddell & Sapp LLP

[57] ABSTRACT

A thermal management device for an enclosure, the enclosure disposed in an environment exposed to ambient air and having an interior area for housing heat generating electronic components includes a heat exchanger having an evaporator portion and a condenser portion, the evaporator portion is adapted for mounting within the enclosure interior area adjacent to the heat generating electronic components. The condenser portion is exposed to the ambient air for removal of heat from the enclosure interior area generated by the electronic components adjacent to the heat exchanger evaporator portion. The device is incorporated in a system which includes an air duct disposed within the enclosure interior area. The duct includes an air inlet port and air outlet port. The ports communicate with the ambient air to thereby create an airflow path through the air duct from the inlet port to the outlet port. The condenser portion of the heat exchanger is adapted to communicate with the air flow path within the air duct, such that heat generated by the electronic components adjacent to the heat evaporator portion of the heat exchanger within the enclosure is removed from the enclosure through the air duct to the environment.

2 Claims, 2 Drawing Sheets

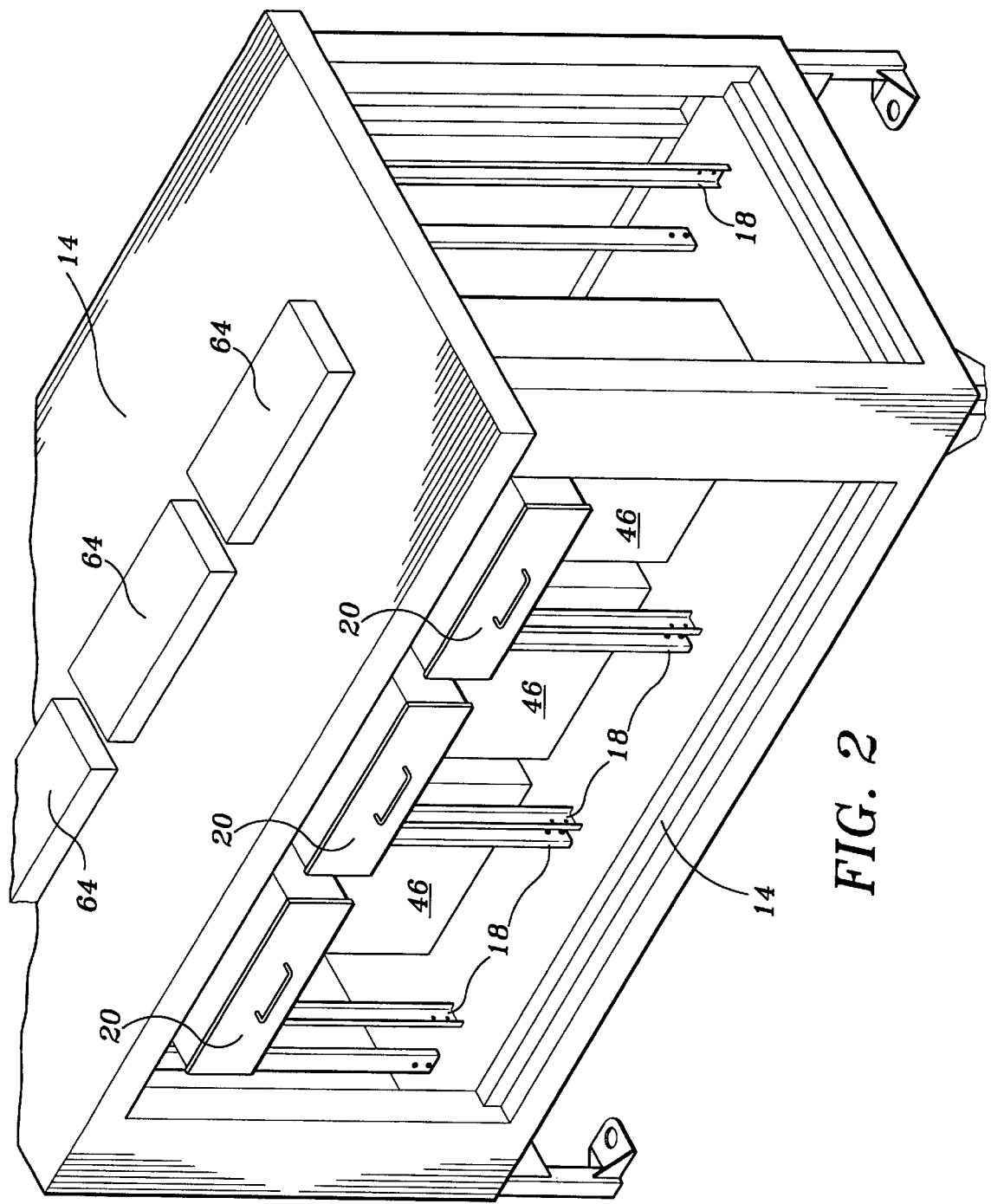

THERMAL MANAGEMENT DEVICE AND SYSTEM FOR AN ELECTRONIC COMPONENT ENCLOSURE

TECHNICAL FIELD OF THE INVENTION

The present invention relates to electronic component enclosures, and more particularly to a device and system for the management of thermal energy created by heat producing equipment housed within such enclosures.

BACKGROUND OF THE INVENTION

Electronic cabinets, enclosures, housings, compartments, and cells (hereinafter referred to as cabinets) often house heat producing equipment. A function of cabinets is to provide a controlled internal environment while simultaneously shielding and protecting the equipment housed therein from the external environment. Internal energy in the form of heat from the equipment can build up over time, resulting is excessively high internal cabinet temperatures, causing equipment reliability problems or equipment failure. The control of the internal temperatures in cabinets is referred to as "thermal management".

Thermal management strategies may often conflict with the requirement that a cabinet protect the equipment from the external environment. The application and performance of thermal management systems significantly affect a cabinet. Adverse effects of thermal management systems include costs, performance, power consumption, restrictions to equipment configuration, and limitations to the overall use of the cabinet. Typically, thermal management systems employ devices to manage heat within the cabinet. These devices have been deficient because of their size, cost, power consumption, poor performance, and poor integration into a cabinet.

Existing cabinet designs rely upon heat sinks, convoluted cross or counter flow air-to-air heat exchangers, vents to the external environment and electronically powered cooling devices. These and other thermal management devices and systems often require excessive amounts of external power to operate, have a high cost, low performance and impose limitations to equipment configuration. Thermal management devices are typically attached to a cabinet wall, ceiling, or floor and require that all internal air be mixed and circulated across the device and then returned to the cabinet system.

A need has thus arisen for a thermal management device and system for electronic component enclosures that achieve high performance, are easily integratable into a cabinet, are versatile for customization, provide low cost, low power consumption, and are easy to install, repair, and maintain.

SUMMARY OF THE INVENTION

In accordance with the present invention, a thermal management device for an enclosure, the enclosure disposed in an environment exposed to ambient air and having an interior area for housing heat generating electronic components is provided. The device includes a heat exchanger having an evaporator portion and a condenser portion, the evaporator portion is adapted for mounting within the enclosure interior area adjacent the heat generating electronic components. The condenser portion is exposed to the ambient air for removal of heat from the enclosure interior area generated by the electronic components adjacent to the heat exchanger evaporator portion.

In accordance with another aspect of the present invention, a thermal management system for an enclosure, the enclosure disposed in an environment exposed to ambient air and having an interior area for housing heat generating electronic components is provided. The system includes a heat exchanger having an evaporator portion and a condenser portion, the evaporator portion being adapted for mounting within the enclosure interior area adjacent to the heat generating electronic components. The system further includes an air duct disposed within the enclosure interior area. The duct includes an air inlet port and air outlet port. The ports communicate with the ambient air to thereby create an airflow path through the air duct from the inlet port to the outlet port. The condenser portion of the heat exchanger is adapted to communicate with the air flow path within the air duct, such that heat generated by the electronic components adjacent to the heat evaporator portion of the heat exchanger within the enclosure is removed from the enclosure through the air duct to the environment.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which:

FIG. 2 is a perspective view of a cabinet including the present thermal management device and system.

DESCRIPTION OF THE PREFERRED EMBODIMENTS

Figure 1:
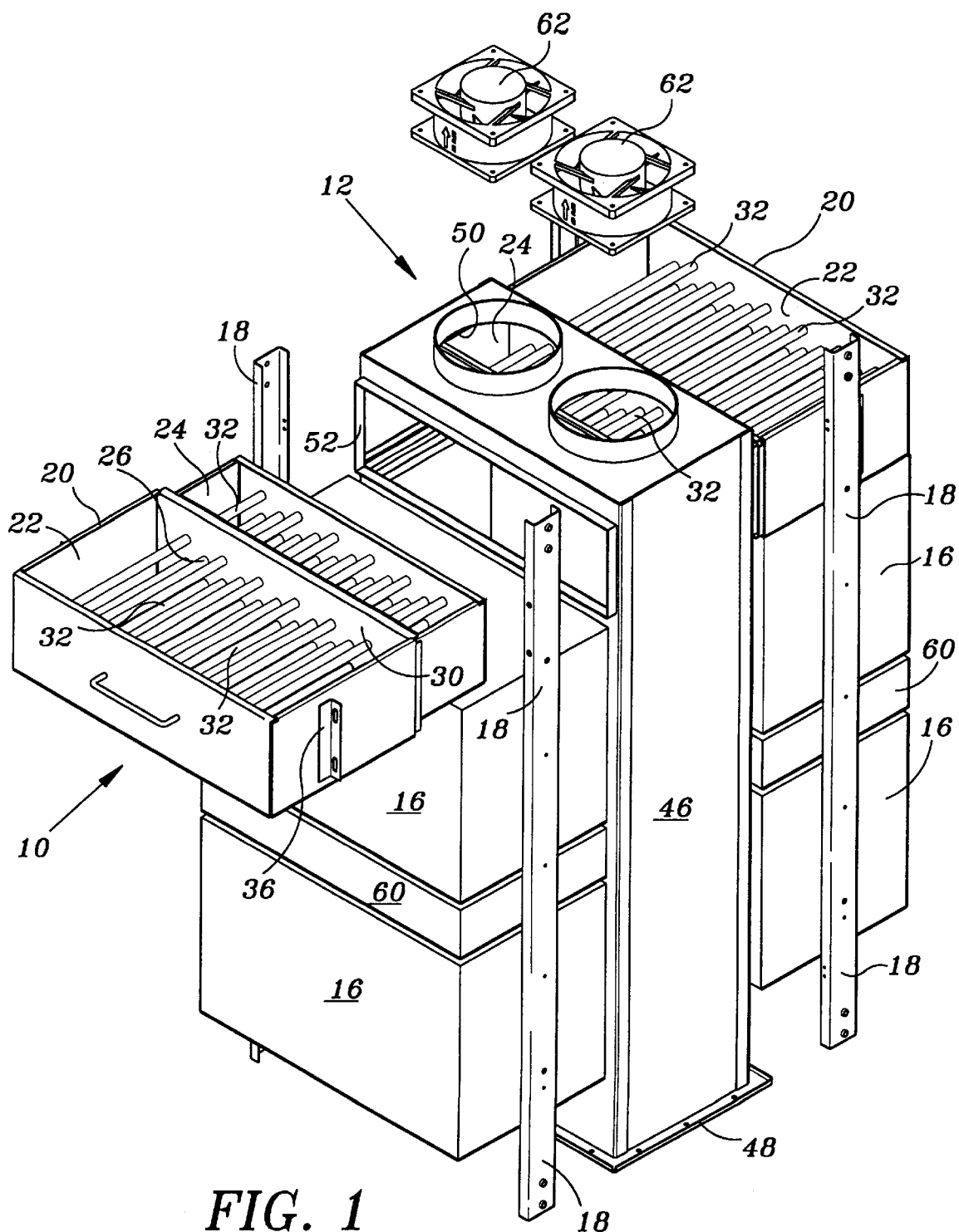
FIG. 1 is a perspective view, partially exploded, of the present thermal management device and system.

Referring simultaneously to FIGS. 1 and 2, the present thermal management device, generally identified by the numeral 10, and thermal management system, generally identified by the numeral 12, is illustrated. Thermal management device 10 and thermal management system 12 are used for controlling internal temperatures within a cabinet, generally identified by the numeral 14, created by electronic components 16 housed within cabinet 14. Electronic components 16 are mounted to mounting rails 18 interconnected within cabinet 14.

Thermal management device 10, includes a heat exchanger, such as, for example, a heat pipe 20, it being understood that the present thermal management device 10 may comprise any type of thermal heat transfer device, that heat pipe 20 is shown for illustrative purposes only, and is not intended to limit the present invention. Additional thermal management devices 10 may include, for example, phase change materials; highly conductive metals, such as copper bars; and electronic cooling devices used in lieu of heat pipe 20 or in combination with heat pipe 20.

Heat pipe 20 includes an evaporator or heat addition region 22 and a condenser or heat rejection region 24. An adiabatic or isothermal region 26 is disposed between evaporator region 22 and condenser region 24. A seal area or gasket 30 separates evaporator region 22 from condenser region 24, and creates an environmental seal between evaporator region 22 and the exterior, ambient environment. When heat is added to evaporator region 22, of heat pipe 20, the working fluid present in pipes 32 is heated until it vaporizes. The high temperature and corresponding high pressure in region 22 causes the vapor to flow to the cooler condenser region 24, where the vapor condenses, giving up its latent heat of evaporation. The capillary forces existing in pipes 32 then pump the liquid back to evaporator region 22. No power is required to operate heat pipe 20.

Heat pipe 20 is adapted to be mounted to mounting rails 18 utilizing brackets 36. Evaporator region 22 of heat pipe 20 is sized to match the "footprint", length and width, of electronic components 16. In this manner, heat is removed from cabinet 14 at the heat source, components 16, in a localized area of cabinet 14 rather than removing heat from the total interior of cabinet 14.

Heat removal from condenser region 24 of heat pipe 20 is accomplished utilizing an air duct 46 mounted within cabinet 14. Air duct 46 includes an air inlet port 48 and air outlet port 50. Ports 48 and 50 communicate with ambient air surrounding cabinet 14 to create an air flow path through duct 46 from inlet port 48 to outlet port 50. Air duct 46 further includes a port 52 which received condenser region 24 of heat pipe 20. Gasket 30 divides heat pipe 20 such that the entire condenser region 24 is housed within duct 46. Gasket 30 thereby prevents the mixing of air within cabinet 14 with air present within air duct 46 and provides a tight seal between heat pipe 20 and air duct 46.

The present system 12 manages heat at the equipment level and transports the heat through heat exchanger 20 into duct 46 for transport to the environment surrounding cabinet 14. Air present within cabinet 14 passes through components 16 and is heated. The heated air passes across evaporator region 22 of heat pipe 20 which then transports heat generated by components 16 from evaporator region 22 to condenser region 24 within duct 46. Heat is then removed from condenser region 24 by ambient air passing through air duct 46 to the environment external to cabinet 14.

To increase the present system's performance, rack mounted fans 60 and air duct fans 62 may be utilized in the present system. Fans 60 and 62 increase the air flow through heat pipe 20 and air duct 46. Vent caps 64 cover fans 62 and outlet port 50.

The present thermal management device 10 is designed as an individual unit for mounting to rails 18. As shown in FIG. 2, six heat pipes 20 are utilized within cabinet 14, three pipes 20 on each side of cabinet 14. Heat pipes 20 are "stand-alone" devices such that one or more heat pipes 20 may be utilized in a cabinet 14. Use of thermal management device 10 allows customization for specific electronic components and environmental conditions. The present thermal management system 12 allows the present device 10 to be mounted into standard equipment rack systems, allowing for easy integration into existing cabinet designs and equipment configurations, without compromising the integrity of the cabinet. The present device 10 is easily installable and removable, which allows for easy replacement, repair, and maintenance. As previously stated, the present invention handles thermal management at the equipment level, removing heat from the source and cooling the specific equipment component which generates the heat, as opposed to other thermal management systems that handle heat at a cabinet level, cooling the entire cabinet. The present invention allows for designs of thermal management devices to match the particular requirements of electronic components within a cabinet. For example, thermal management devices 10 may be configured differently for each rack of equipment within cabinet 14 allowing for each rack or piece of equipment to have a unique thermal management system to efficiently handle thermal management on an individual basis without burdening other areas of the cabinet. Utilization other areas of the cabinet. Utilization of the present invention increases thermal performance while minimizing costs.

Whereas the present invention has been described with respect to specific embodiments thereof, it will be understood that various changes and modifications will be suggested to one skilled in the art and it is intended to encompass such changes and modifications as fall within the scope of the appended claims.

We claim:

1. A thermal management system for an enclosure, the enclosure disposed in an environment exposed to ambient air, the enclosure having an interior area for housing a plurality of heat generating electronic components, the components disposed within a plurality of zones within the area, and the components having a width dimension and length dimension, the system comprising:

a plurality of rails disposed within each zone of the interior area of the enclosure for mounting the components;

a plurality of heat exchangers each having a heat collector portion and a heat rejector portion, the heat collector portion having a width dimension substantially equal to the width dimension of the components and a length dimension substantially equal to the length dimension of the components and being adapted for removable mounting to said rails within each zone of the enclosure interior area directly adjacent to the heat generating electronic components within a zone, the heat rejector portion being exposed to the ambient air for removal of heat from a zone of the enclosure interior area which is generated by the electronic components adjacent to said heat exchanger heat collector portion;

an air duct disposed within the enclosure interior area, the air duct having an air inlet port and an air outlet port, said ports communicating with the ambient air to thereby create an air flow path through said air duct from said inlet port to said outlet port; and said heat rejector portion of said heat exchanger adapted to communicate with said air flow path within said air duct, such that heat generated by electronic components adjacent to said heat collector portion of said heat exchanger within each zone of the enclosure is removed from the enclosure through said air duct to the environment, and such that the temperature of each zone of the interior area of the enclosure is managed independently of the other zones.

2. The system of claim 1 wherein said heat exchanger comprises a heat pipe.

* * * * *